(12) United States Patent
Yang et al.

(10) Patent No.: US 12,295,204 B2
(45) Date of Patent: May 6, 2025

(54) POLARIZER-FREE DISPLAYS

(71) Applicant: Apple Inc., Cupertino, CA (US)

(72) Inventors: Young Cheol Yang, Sunnyvale, CA (US); Bhadrinarayana Lalgudi Visweswaran, San Mateo, CA (US); Michelle C Sherrott, Cupertino, CA (US); Fuyi Yang, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 484 days.

(21) Appl. No.: 17/824,787

(22) Filed: May 25, 2022

(65) Prior Publication Data
US 2023/0057334 A1    Feb. 23, 2023

Related U.S. Application Data

(60) Provisional application No. 63/235,387, filed on Aug. 20, 2021.

(51) Int. Cl.
*H01L 29/08*    (2006.01)
*H10K 50/854*    (2023.01)
(Continued)

(52) U.S. Cl.
CPC ......... *H10K 50/854* (2023.02); *H10K 59/122* (2023.02); *H10K 59/352* (2023.02); *H10K 59/353* (2023.02); *H10K 59/38* (2023.02)

(58) Field of Classification Search
CPC .. H10K 50/854; H10K 59/353; H10K 59/122; H10K 59/38; H10K 59/352;
(Continued)

(56) References Cited

U.S. PATENT DOCUMENTS 10,578,967 B2    3/2020    Choi et al.
2008/0143649 A1    6/2008    Asaki et al.
(Continued)

FOREIGN PATENT DOCUMENTS

CN    112436043 A    3/2021
EP    3506381 A1    7/2019
(Continued)

OTHER PUBLICATIONS

Guanjun Tan et al., High ambient contrast ratio OLED and QLED without a circular polarizer, Journal of Physics D: Applied Physics, Jul. 2016, IOP Publishing, Philadelphia, PA, United States.
(Continued)

*Primary Examiner* — Niki H Nguyen
*Assistant Examiner* — Niki T Nguyen
(74) *Attorney, Agent, or Firm* — Treyz Law Group, P.C.; Joseph F. Guihan; Jinie M. Guihan

(57) ABSTRACT

The circular polarizer may be omitted from a display to increase efficiency. A polarizer-free display may use other non-polarizer techniques to mitigate reflections of ambient light and mitigate diffraction reflection artifacts. The polarizer-free display may include a black pixel definition layer that absorbs ambient light. Color filter elements may be included in a black matrix to mitigate ambient light reflections. An intra-anode phase shift layer and/or an inter-anode phase shift layer may be included in the display to mitigate diffractive reflection artifacts. Multiple sub-pixels of the same color may be used in a single pixel to ensure a neutral reflection color. The display may include a cathode layer that is patterned to have openings over the black pixel definition layer to mitigate reflections. The display may include diffusive particles (in the color filter element or in a separate diffuser layer) to mitigate diffractive reflection artifacts.

20 Claims, 13 Drawing Sheets

(51) Int. Cl.
*H10K 59/122* (2023.01)
*H10K 59/35* (2023.01)
*H10K 59/38* (2023.01)

(58) Field of Classification Search
CPC .... H10K 50/85; H10K 50/852; H10K 50/856; H10K 50/865; H10K 59/50; H10K 59/8051; H10K 59/80515; H10K 59/877; H10K 59/8791; H10K 59/8792; H10K 71/00
See application file for complete search history.

(56) References Cited

U.S. PATENT DOCUMENTS

| | | | |
|---|---|---|---|
| 2015/0029208 A1* | 1/2015 | Kim | G09G 3/2074 345/590 |
| 2015/0287767 A1* | 10/2015 | Lee | H10K 59/353 257/40 |
| 2020/0286970 A1 | 9/2020 | Yu | |
| 2021/0184178 A1 | 6/2021 | Yu | |
| 2021/0202628 A1 | 7/2021 | Kim et al. | |

FOREIGN PATENT DOCUMENTS

| | | |
|---|---|---|
| EP | 3614447 A1 | 2/2020 |
| EP | 3772101 A1 | 2/2021 |
| JP | 2011034884 A | 2/2011 |

OTHER PUBLICATIONS

Hyunsu Cho et al., Polarizer-free, high-contrast inverted top-emitting organic light emitting diodes: effect of the electrode structure, Optics Express, Jan. 2012, pp. 1816-1824, vol. 20, No. 2, Optical Society of America, Washington, DC, United States.

Hyunsu Cho et al., Dual optical role of low-index injection layers for efficient polarizer-free high contrast-ratio organic light-emitting diodes, Optics Express, Apr. 2015, pp. 10259-10265, vol. 23, No. 8, Optical Society of America, Washington, DC, United States.

Hyunsu Cho et al., Polarizer-free, high-contrast-ratio organic lightemitting diodes utilizing microcavity structures and heutral-density filters, Journal of Information Display, Oct. 2014, pp. 195-199, vol. 15, No. 4, Taylor and Francis LTD, United Kingdom.

[Press Release] Samsung Display Unveils New Eco² OLED™ that Reduces Power Consumption, Offers Enhanced Under-Panel Camera, and Features Eco-Friendly Design, Samsung Display Newsroom, Aug. 2021, Samsung, Gyeonggi-do, Korea.

Ross Young, New Insights on How SDC Will Introduce Polarizer-Free OLEDS, Significant Increase in Brightness Also Expected, Display Supply Chain, Mar. 2021, DSCC, Austin, TX, United States.

* cited by examiner

POLARIZER-FREE DISPLAYS

This application claims priority to U.S. provisional patent application No. 63/235,387, filed Aug. 20, 2021, which is hereby incorporated by reference herein in its entirety.

BACKGROUND

Electronic devices often include displays. For example, cellular telephones and portable computers include displays for presenting information to users. An electronic device may have an organic light-emitting diode display based on organic-light-emitting diode pixels or a liquid crystal display based on liquid crystal pixels. Displays sometimes include a circular polarizer to mitigate reflections. However, the circular polarizer may decrease the efficiency of the display.

It is within this context that the embodiments herein arise.

SUMMARY

An electronic device may include a display such as an organic light-emitting diode display. Some organic light-emitting diode displays may include a circular polarizer to mitigate reflections of ambient light. Although effective at mitigating ambient light reflections, a circular polarizer reduces the efficiency of the organic light-emitting diode display. The display light emitted by pixels passes through the circular polarizer when exiting the display, reducing the intensity of the display light exiting display.

The circular polarizer may be omitted from the display. Omitting the circular polarizer in the display increases the efficiency of the display. Additionally, omitting the circular polarizer in the display may help align the neutral stress plane of the display with sensitive components in display panel, making the display more robust to bending and folding.

A polarizer-free display may use other non-polarizer techniques to mitigate reflections of ambient light, mitigate diffraction reflection artifacts, and preserve a high contrast for the display. The polarizer-free display may include a black pixel definition layer that absorbs ambient light. The pixel definition layer may also have a low taper angle. Color filter elements may be included in a black matrix to mitigate ambient light reflections. An intra-anode phase shift layer and/or an inter-anode phase shift layer may be included in the display to mitigate diffractive reflection artifacts. Multiple sub-pixels of the same color may be used in a single pixel to ensure a neutral reflection color. The display may include a cathode layer that is patterned to have openings over the black pixel definition layer to mitigate reflections. The display may include diffusive particles (in the color filter element or in a separate diffuser layer) to mitigate diffractive reflection artifacts.

DETAILED DESCRIPTION

Figure 1:
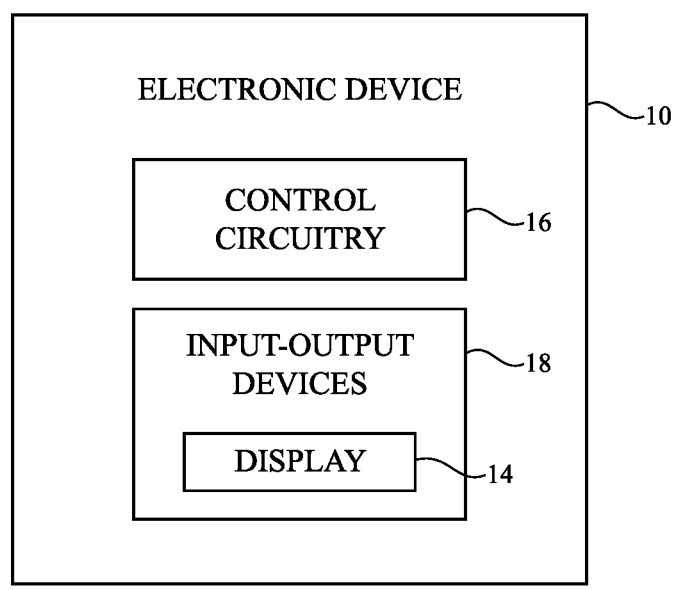
FIG. 1 is a schematic diagram of an illustrative electronic device having a display in accordance with an embodiment.

An illustrative electronic device of the type that may be provided with a display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wristwatch device, a pendant device, a headphone or earpiece device, an augmented reality (AR) headset and/or virtual reality (VR) headset, a device embedded in eyeglasses or other equipment worn on a user's head, or other wearable or miniature device, a display, a computer display that contains an embedded computer, a computer display that does not contain an embedded computer, a gaming device, a navigation device, an embedded system such as a system in which electronic equipment with a display is mounted in a kiosk or automobile, or other electronic equipment.

As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 18 may be used to allow data to be supplied to device 10 and to allow data to be provided from device 10 to external devices. Input-output devices 18 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 18 and may receive status information and other output from device 10 using the output resources of input-output devices 18.

Input-output devices 18 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Control circuitry 16 may be used to run software on device 10 such as operating system code and applications. During operation of device 10, the software running on control circuitry 16 may display images on display 14.

Display 14 may be an organic light-emitting diode display, a display formed from an array of discrete light-emitting diodes each formed from a crystalline semiconductor die, or any other suitable type of display. Configurations in which the pixels of display 14 include light-emitting diodes are sometimes described herein as an example. This is, however, merely illustrative. Any suitable type of display may be used for device 10, if desired (e.g., a liquid crystal display).

In some cases, electronic device 10 may be a wristwatch device. Display 14 of the wristwatch device may be positioned in a housing. A wristwatch strap may be coupled to the housing.

Figure 2:
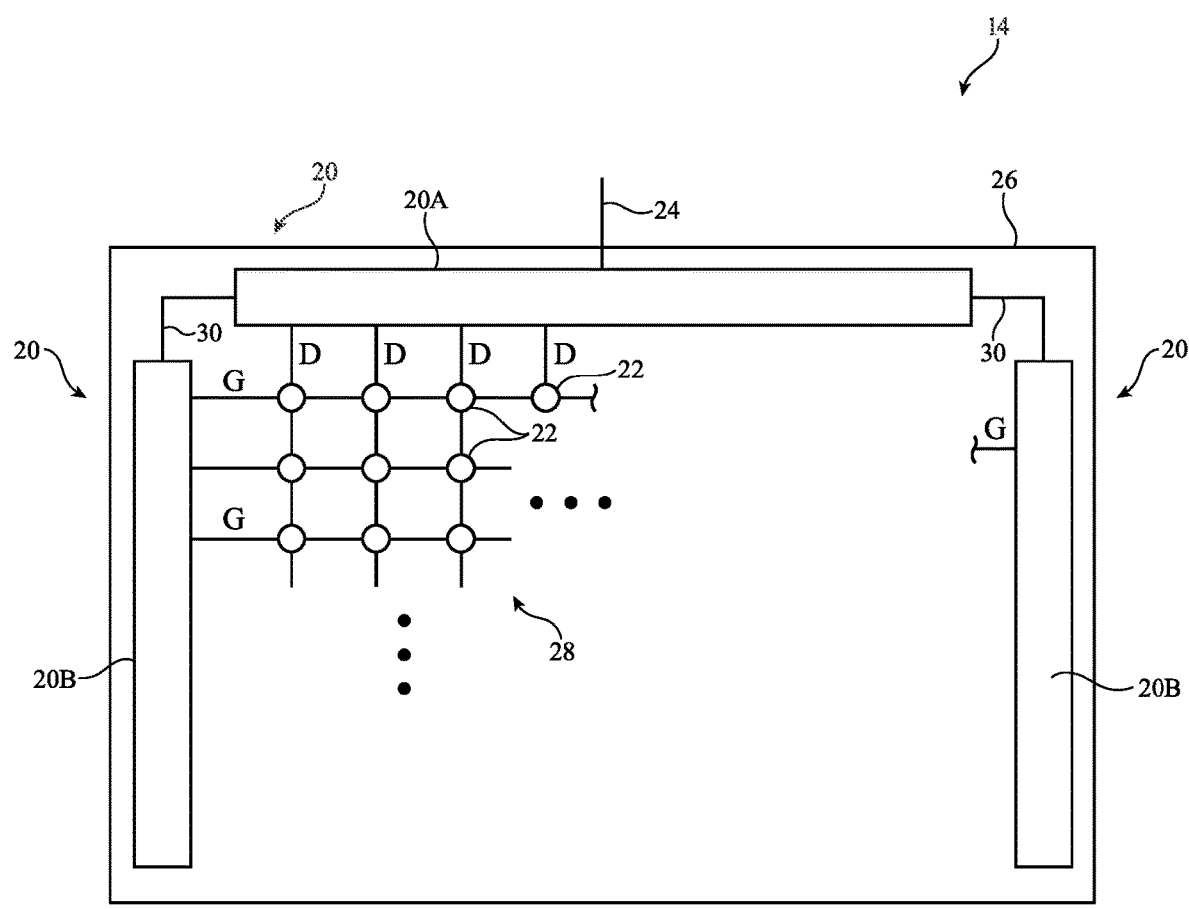
FIG. 2 is a schematic diagram of an illustrative display in accordance with an embodiment.

FIG. 2 is a diagram of an illustrative display. As shown in FIG. 2, display 14 may include layers such as substrate layer 26. Substrate layers such as layer 26 may be formed from rectangular planar layers of material or layers of material with other shapes (e.g., circular shapes or other shapes with one or more curved and/or straight edges). The substrate layers of display 14 may include glass layers, polymer layers, composite films that include polymer and inorganic materials, metallic foils, etc.

Display 14 may have an array of pixels 22 for displaying images for a user such as pixel array 28. Pixels 22 in array 28 may be arranged in rows and columns. The edges of array 28 (sometimes referred to as active area 28) may be straight or curved (i.e., each row of pixels 22 and/or each column of pixels 22 in array 28 may have the same length or may have a different length). There may be any suitable number of rows and columns in array 28 (e.g., ten or more, one hundred or more, or one thousand or more, etc.). Display 14 may include pixels 22 of different colors. As an example, display 14 may include red pixels, green pixels, and blue pixels. If desired, a backlight unit may provide backlight illumination for display 14.

Display driver circuitry 20 may be used to control the operation of pixels 28. Display driver circuitry 20 may be formed from integrated circuits, thin-film transistor circuits, and/or other suitable circuitry. Illustrative display driver circuitry 20 of FIG. 2 includes display driver circuitry 20A and additional display driver circuitry such as gate driver circuitry 20B. Gate driver circuitry 20B may be formed along one or more edges of display 14. For example, gate driver circuitry 20B may be arranged along the left and right sides of display 14 in an inactive area of the display as shown in FIG. 2. Gate driver circuitry 20B may include gate drivers and emission drivers.

As shown in FIG. 2, display driver circuitry 20A (e.g., one or more display driver integrated circuits, thin-film transistor circuitry, etc.) may contain communications circuitry for communicating with system control circuitry over signal path 24. Path 24 may be formed from traces on a flexible printed circuit or other cable. The control circuitry may be located on one or more printed circuits in electronic device 10. During operation, the control circuitry (e.g., control circuitry 16 of FIG. 1) may supply circuitry such as a display driver integrated circuit in circuitry 20 with image data for images to be displayed on display 14. Display driver circuitry 20A of FIG. 2 is located at the top of display 14. This is merely illustrative. Display driver circuitry 20A may be located at both the top and bottom of display 14 or in other portions of device 10.

To display the images on pixels 22, display driver circuitry 20A may supply corresponding image data to data lines D (e.g., vertical signal lines) while issuing control signals to supporting display driver circuitry such as gate driver circuitry 20B over signal paths 30. With the illustrative arrangement of FIG. 2, data lines D run vertically through display 14 and are associated with respective columns of pixels 22. During compensation operations, column driver circuitry 20 may use paths such as data lines D to supply a reference voltage.

Gate driver circuitry 20B (sometimes referred to as gate line driver circuitry or horizontal control signal circuitry) may be implemented using one or more integrated circuits and/or may be implemented using thin-film transistor circuitry on substrate 26. Horizontal control lines G (sometimes referred to as gate lines, scan lines, emission control lines, etc.) run horizontally through display 14. Each gate line G is associated with a respective row of pixels 22. If desired, there may be multiple horizontal control lines such as gate lines G associated with each row of pixels. Individually controlled and/or global signal paths in display 14 may also be used to distribute other signals (e.g., power supply signals, etc.). The number of horizontal signal lines in each row may be determined by the number of transistors in the display pixels 22 that are being controlled independently by the horizontal signal lines. Display pixels of different configurations may be operated by different numbers of control lines, data lines, power supply lines, etc.

Gate driver circuitry 20B may assert control signals on the gate lines G in display 14. For example, gate driver circuitry 20B may receive clock signals and other control signals from circuitry 20A on paths 30 and may, in response to the received signals, assert a gate line signal on gate lines G in sequence, starting with the gate line signal G in the first row of pixels 22 in array 28. As each gate line is asserted, data from data lines D may be loaded into a corresponding row of pixels. In this way, control circuitry such as display driver circuitry 20A and 20B may provide pixels 22 with signals that direct pixels 22 to display a desired image on display 14. Each pixel 22 may have a light-emitting diode and circuitry (e.g., thin-film circuitry on substrate 26) that responds to the control and data signals from display driver circuitry 20.

Figure 3A:
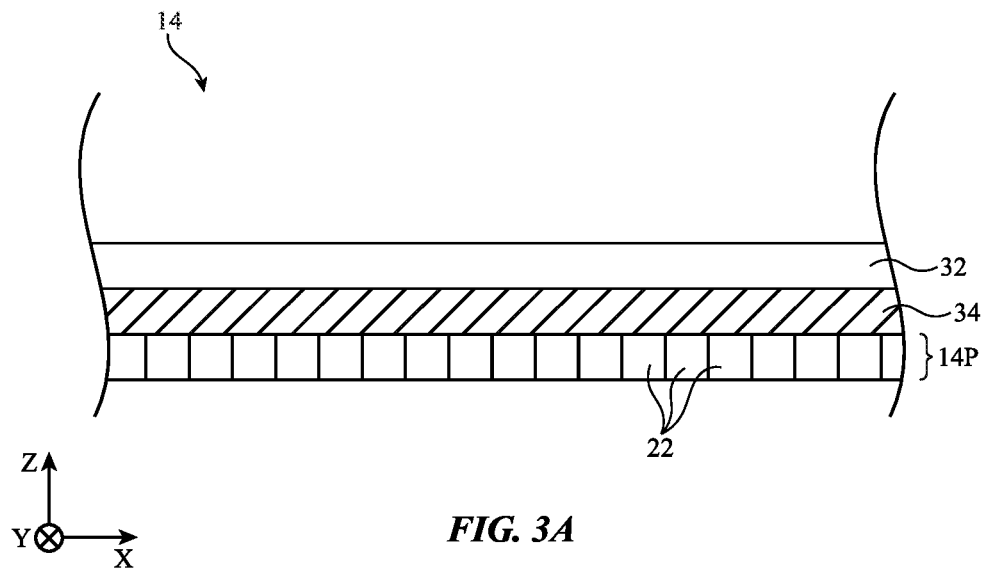
FIG. 3A is a cross-sectional side view of an illustrative display with a circular polarizer in accordance with an embodiment.

Some displays may include a circular polarizer to mitigate reflections of ambient light. As shown in FIG. 3A, display 14 includes a display panel 14P with an array of pixels 22. Display panel 14P may be an organic light-emitting diode display panel, a display panel formed from an array of discrete light-emitting diodes each formed from a crystalline semiconductor die, a liquid crystal display panel, or any other suitable type of display. The display panel 14P is covered by a display cover layer 32. Display cover layer 32 may be a transparent material that forms an outer surface of the display (and device 10). The display cover layer 32 may protect the underlying display panel from damage during operation of the device. The display cover layer 32 may be formed from plastic, glass, sapphire, or any other desired material.

In FIG. 3A, a circular polarizer 34 is interposed between the display panel 14P and the display cover layer 32. Circular polarizer 34 may include a linear polarizer and a quarter wave plate. The circular polarizer serves to mitigate undesired reflections of ambient light off of display panel 14P. When ambient light passes in the negative Z-direction through display cover layer 32 and circular polarizer 34, the light becomes circularly polarized. The light may subsequently reflect off of reflective layers of display panel 14P (e.g., anodes for the pixels 22 in display panel 14P). The reflected light (now traveling in the positive Z-direction) has the opposite circular polarization and is subsequently absorbed by the circular polarizer 34. The circular polarizer 34 therefore effectively prevents ambient light reflections off of display panel 14P, improving contrast in display 14.

Although effective at mitigating ambient light reflections, circular polarizer 34 reduces the efficiency of display 14. The display light emitted by pixels 22 passes through circular polarizer 34 when exiting the display. This reduces the intensity of the display light exiting display 14.

Figure 3B:
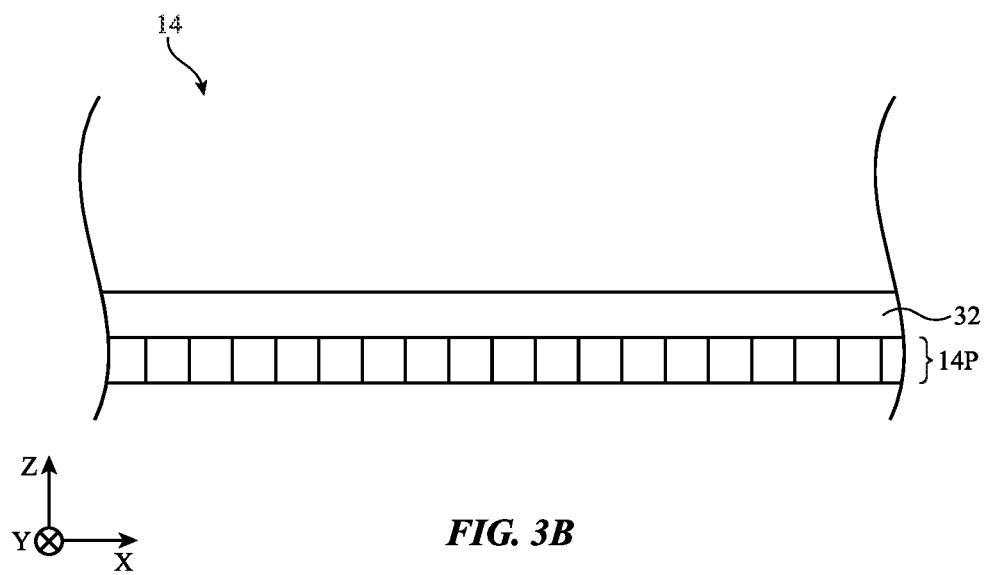
FIG. 3B is a cross-sectional side view of an illustrative display without a circular polarizer in accordance with an embodiment.

To improve the efficiency of the display, circular polarizer 34 may be omitted from the display. FIG. 3B is a cross-sectional side view of a display of this type. As shown, display cover layer 32 is formed over display panel 14P without an intervening circular polarizer. This type of display may sometimes be referred to as a polarizer-free display, a circular-polarizer-free display, a polarizer-free OLED display, circular-polarizer-free OLED display etc.

Omitting the circular polarizer in display 14 increases the efficiency of the display. Additionally, omitting the circular polarizer in display 14 may help align the neutral stress plane of the display with sensitive components in display panel 14P (e.g., the thin-film transistor circuitry in the display panel). This makes the display more robust to bending and folding. Yet another advantage of omitting the circular polarizer is improved efficiency/performance for input-output components that operate through the display. For example, an optical sensor may sense light that passes through the display. Omitting the circular polarizer increases the signal-to-noise ratio for the optical sensor.

Figure 4:
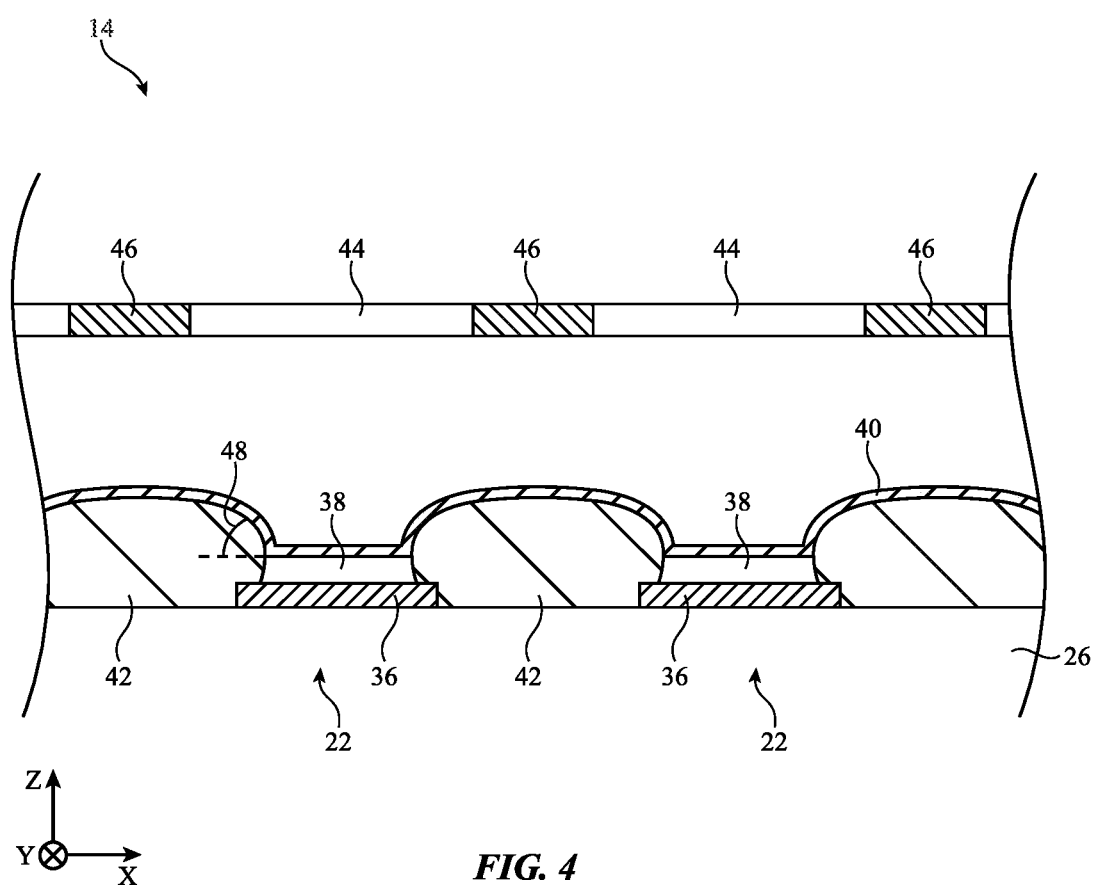
FIG. 4 is a cross-sectional side view of an illustrative display with a black pixel definition layer and color filter elements in accordance with an embodiment.

The polarizer-free display may use other techniques to mitigate reflections of ambient light and preserve a high contrast for the display. FIG. 4 is a cross-sectional side view of an illustrative polarizer-free OLED display. As shown, the display includes organic light-emitting diode pixels 22 on substrate 26. Each OLED pixel 22 include an electrode (anode) 36, OLED layers 38, and a common electrode (cathode) 40. The OLED layers 38 may include OLED layers such as a hole injection layer, a hole transport layer, an emissive layer, an electron transport layer, an electronic injection layer, an electron blocking layer, a charge generation layer, and/or a hole blocking layer. Each pixel may include a single diode or a tandem diode. A common cathode 40 is formed over the array of pixels. The cathode may be formed as a blanket layer across the entire array and serves as the cathode electrode for each pixel in the display. The OLED layers 38 are interposed between the cathode 40 and respective anodes 36. Each pixel may have an emissive layer of a selected color (e.g., red, green, or blue) as one of its OLED layers 38.

Display 14 also includes a pixel definition layer 42. The pixel definition layer 42 may be formed from a dielectric material and may be used to define light-emitting apertures for each pixel. The OLED layers 38 and corresponding anodes 36 are formed in the apertures defined by the pixel definition layer 42. To mitigate reflections of ambient light, pixel definition layer 42 may be formed from a black material that absorbs light. Ambient light that reaches the pixel definition layer 42 is therefore absorbed instead of reflected towards the viewer (e.g., in the positive Z-direction).

Pixel definition layer 42 may reflect less than 20% of incident light, less than 10% of incident light, less than 5% of incident light, less than 3% of incident light, less than 1% of incident light, etc.

To mitigate reflections of ambient light, display 14 also includes color filter elements 44 that are formed within openings in a grid of black matrix 46 (sometimes referred to as black masking layer 46, opaque masking layer 46, etc.). Each color filter element 44 may overlap a respective pixel 22 that emits light at a given color (wavelength). Each color filter element 44 may transmit light at the given wavelength for its overlapped pixel while blocking light for other wavelengths. For example, each red OLED pixel 22 is overlapped by a red color filter 44 that transmits red light while blocking blue light and green light. Each green OLED pixel 22 is overlapped by a green color filter 44 that transmits green light while blocking blue light and red light. Each blue OLED pixel 22 is overlapped by a blue color filter 44 that transmits blue light while blocking red light and green light.

The color filter elements 44 allow light from the display pixels to pass through to the viewer. Therefore, the display performance is not negatively impacted by the color filter elements. Simultaneously, the color filter elements 44 block much of the ambient light from being reflected. Each blue color filter element blocks red and green ambient light from being reflected, each red color filter element blocks blue and green ambient light from being reflected, and each green color filter element blocks red and blue ambient light from being reflected.

Black matrix 46 may be formed from any desired material that absorbs light. Black matrix 46 may reflect less than 20% of incident light, less than 10% of incident light, less than 5% of incident light, less than 3% of incident light, less than 1% of incident light, etc. Black matrix 46 may transmit less than 20% of incident light, less than 10% of incident light, less than 5% of incident light, less than 3% of incident light, less than 1% of incident light, etc. Black matrix 46 may absorb more than 50% of incident light, more than 75% of incident light, more than 90% of incident light, more than 95% of incident light, etc. Black matrix 46 blocks ambient light from reflecting off the display.

Using the color filter layer (with color filter elements 44 in a black matrix 46) and black pixel definition layer 42 may significantly reduce reflections of ambient light in polarizer-free display 14. However, other techniques may be used to further mitigate ambient light reflections and artifacts associated with the ambient light reflections.

Ambient light reflections in a polarizer-free display may have associated diffractive reflection artifacts and diffusive reflection artifacts (caused by the periodic arrangement of the reflective structures on display panel 14P). A halo effect with colorful fringes may also be observed in some reflections off of the polarizer-free display.

As shown in FIG. 4, pixel definition layer 42 has a taper angle 48. The taper angle 48 is the angle of the pixel definition layer relative to the upper surface of the anode/substrate (e.g., the XY-plane) at the edge of the pixel definition layer (e.g., at a point in the Z-direction aligned with an upper surface of OLED layers 38 for the pixel, aligned with an upper surface of anode 36, etc.). Reducing the magnitude of taper angle 48 may mitigate the halo effect in the polarizer-free display. Taper angle 48 may be less than 80 degrees, less than 60 degrees, less than 40 degrees, less than 20 degrees, less than 10 degrees, etc.

To suppress the diffractive reflection artifacts associated with a polarizer-free display, a phase randomization layer 50 (sometimes referred to as phase shift layer 50, phase randomization film 50, or phase shift film 50) may be included in the display. The phase randomization layer 50 may be formed from a dielectric material such as silicon nitride or any other desired material. The phase randomization layer 50 may be included under some but not all of the anodes 36 in the display. The anodes that overlap the phase randomization layer may be formed directly on the phase randomization layer such that the phase randomization layer is between the substrate and the anode. In this way, the upper surfaces of the anodes are at different relative positions in the Z-direction. For example, in FIG. 5, the anode on the right overlaps the phase randomization layer 50 and therefore has an upper surface that is shifted in the positive Z-direction relative to the upper surface of the anode on the left. Similarly, the portion of the cathode overlapping the anode on the right is shifted in the positive Z-direction relative to portion of the cathode overlapping the anode on the left. This causes a phase shift in the reflections off of the pixel on the right relative to the reflections off of the pixel on the left. Randomizing the phase of the reflections in this manner mitigates diffractive reflection artifacts associated with display 14.

Each portion of phase randomization layer 50 may have the same thickness or different portions of phase randomization layer 50 may have different thicknesses. Each portion of phase randomization layer 50 may have a thickness that is less than 50 microns, less than 20 microns, less than 10 microns, less than 5 microns, less than 3 microns, less than 1 microns, less than 0.1 microns, greater than 0.1 microns, etc.

Figure 5:
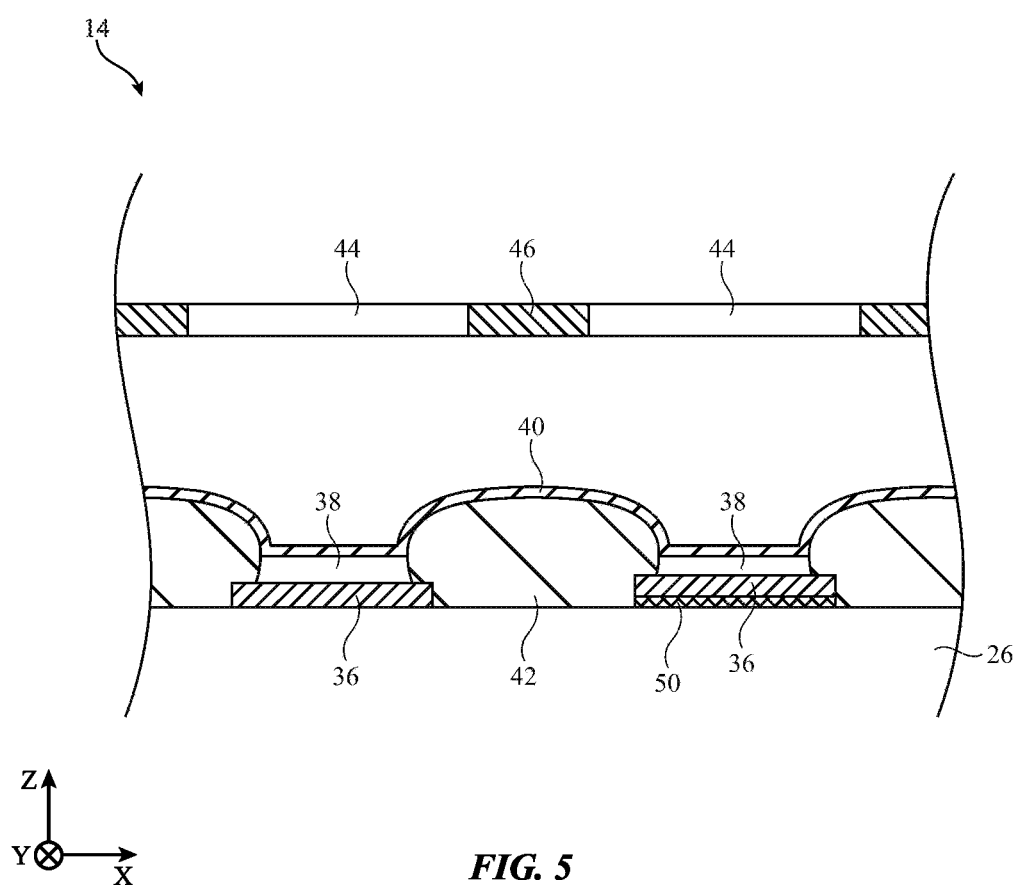
FIG. 5 is a cross-sectional side view of an illustrative display with an inter-anode phase randomization film in accordance with an embodiment.
Figure 6:
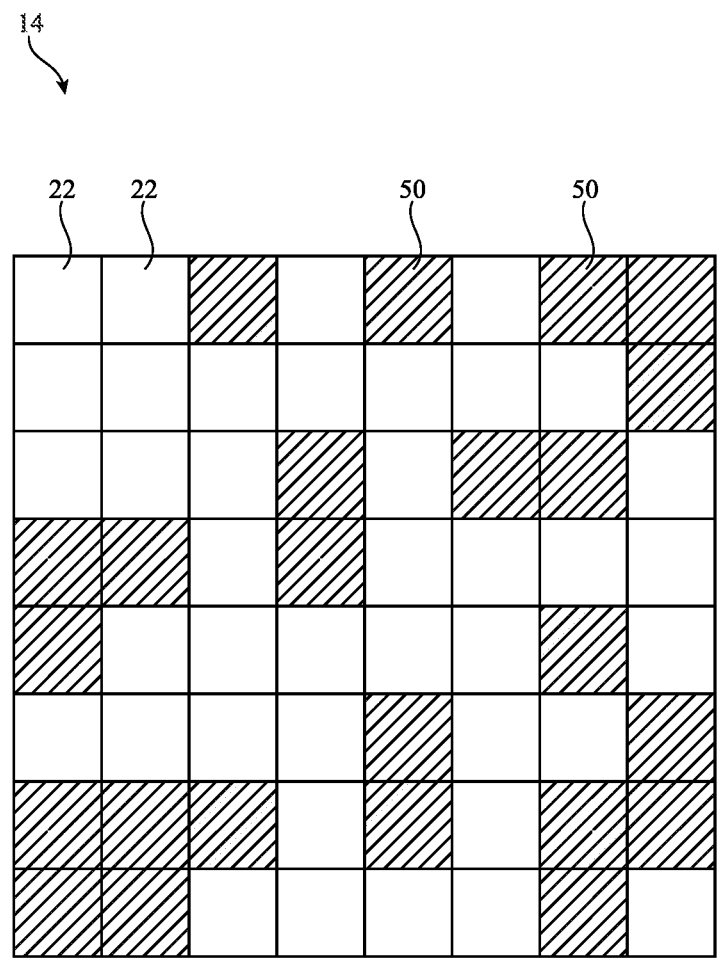
FIG. 6 is a top view of an illustrative display with an inter-anode phase randomization layer in accordance with an embodiment.

FIG. 6 is a top view of an illustrative array of pixels showing how the phase randomization layer may randomly cover or not cover each pixel. Each square represents an associated pixel in the display. Some but not all of the pixels include a portion of phase randomization layer 50 (e.g., having the structure on the right in FIG. 5). The phase randomization layer 50 may be distributed randomly or according to a predetermined pattern that mitigates diffraction artifacts.

In FIGS. 5 and 6, a phase randomization layer portion 50 is selectively applied to each individual anode. Phase randomization layer 50 may therefore sometimes be referred to as inter-anode phase randomization layer 50. This example is merely illustrative. In another possible arrangement, a phase randomization layer portion 50 may selectively be applied to groups of anodes (e.g., a group of sub-pixels that form a pixel). In yet another possible arrangement, only a portion of a single anode may be phase shifted.

Figure 7:
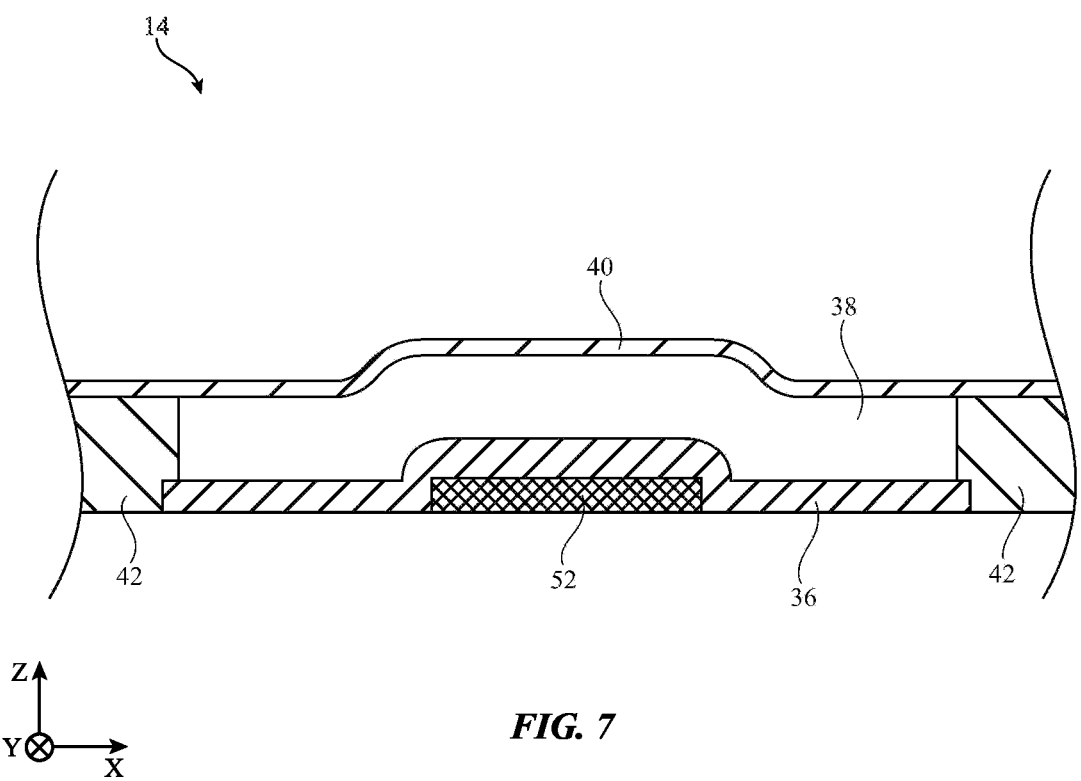
FIG. 7 is a cross-sectional side view of an illustrative display with an intra-anode phase shift layer in accordance with an embodiment.

FIG. 7 is a cross-sectional side view of an illustrative display pixel with a phase shift layer 52. The phase shift layer 52 may be formed from a dielectric material such as silicon nitride or any other desired material. The phase shift layer 52 may be included under some but not all of the anode 36. In this way, the upper surface of the anode is at different relative positions in the Z-direction. For example, in FIG. 7, the anode has an upper surface with a central portion that is shifted in the positive Z-direction relative to the edge portions. This causes a phase shift in reflections off of the central portion of the anode relative to reflections off of the edge portions of the anode. Phase shift layer 52 may sometimes be referred to as intra-anode phase shift layer 52.

Each portion of phase shift layer 52 may have the same thickness or different portions of phase randomization layer 52 may have different thicknesses. Each portion of phase randomization layer 52 may have a thickness that is less than 50 microns, less than 20 microns, less than 10 microns, less than 5 microns, less than 3 microns, less than 1 microns, less than 0.1 microns, greater than 0.1 microns, etc.

There are many possible options for the shape of phase shift layer 52. FIGS. 8A-8D are top views of respective phase shift layers 52. In FIGS. 8A-8D, the anodes 36 have a square shape. This example is merely illustrative. In general, the anode may have any desired shape (e.g., non-square rectangular, circular, elliptical, etc.).

Figure 8A:
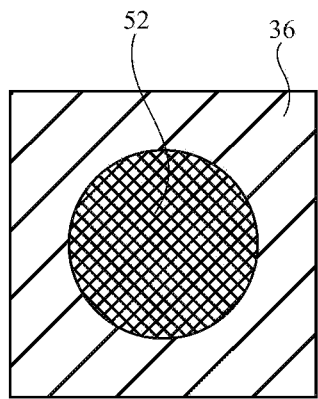
FIGS. 8A-8D are top views of various illustrative intra-anode phase shift layers in accordance with an embodiment.
Figure 8B:
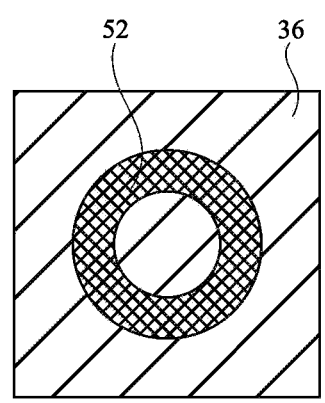
Figure 8C:
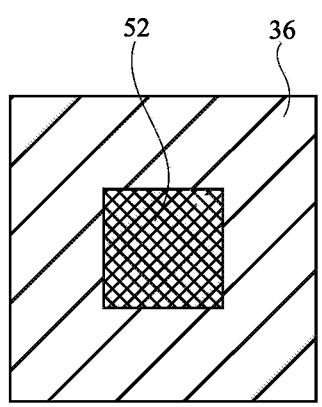
Figure 8D:
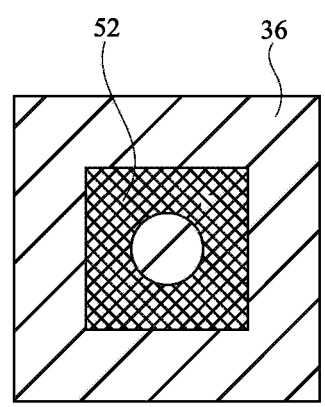

In FIG. 8A, phase shift layer 52 has a circular shape. In FIG. 8B, phase shift layer 52 has an annular shape (e.g., ring-shape) with a central opening. The central opening in FIG. 8B is circular and the outer perimeter of the ring-shaped phase shift layer is circular. In FIG. 8C, phase shift layer 52 has a square shape. In FIG. 8D, phase shift layer 52 has an annular shape (e.g., ring-shape) with a central opening. The central opening in FIG. 8D is circular and the outer perimeter of the ring-shaped phase shift layer is square. These examples are merely illustrative. In general, each pixel may include an anode of any desired shape and a phase shift layer of any desired shape.

In one possible arrangement, every anode in the display may overlap a phase shift layer portion of the same shape. In another possible arrangement, different anodes in the display may overlap phase shift layer portions of different shapes and/or some anodes may not overlap phase shift layer portions at all.

The intra-anode phase shift layers of FIGS. 7 and 8A-8D may mitigate diffractive reflection artifacts in the polarizer-free display.

Figure 9:
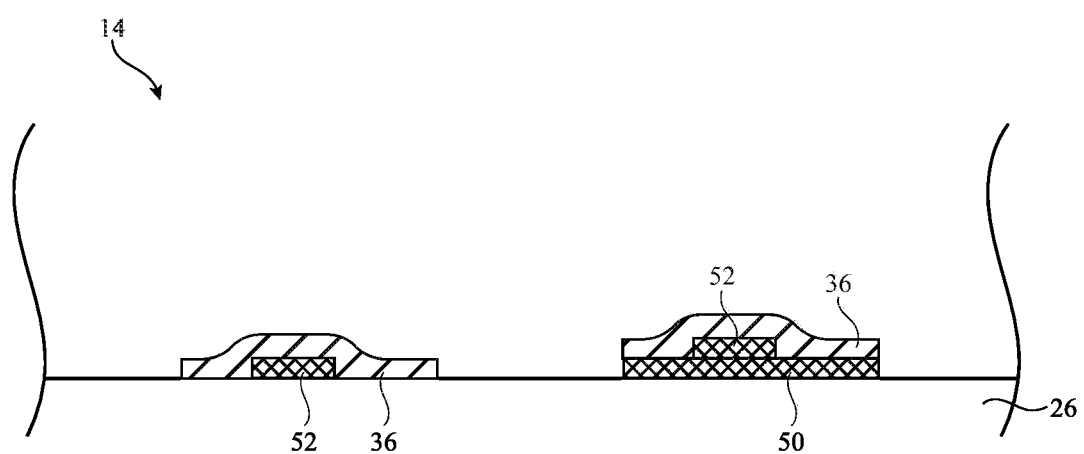
FIG. 9 is a cross-sectional side view of an illustrative display with an inter-anode phase randomization layer and an intra-anode phase shift layer in accordance with an embodiment.

In yet another possible arrangement, the inter-anode phase randomization layer 50 and intra-anode phase shift layer 52 may both be included in the display. FIG. 9 is a cross-sectional side view of an illustrative display with both inter-anode phase randomization layer 50 and intra-anode phase shift layer 52. As shown, every anode may include an intra-anode phase shift layer portion that overlaps some but not all of the anode 36 (similar to as shown in FIGS. 7 and 8A-8D). Additionally, some but not all of the anodes may include a phase randomization layer portion (as shown in FIGS. 5 and 6).

Phase randomization layer 50 and phase shift layer 52 may be formed from the same material (e.g., silicon nitride). Therefore, as shown on the right in FIG. 9, when both phase randomization layer 50 and phase shift layer 52 are present, a unitary two-tiered phase shift layer may be formed.

Figure 10A:
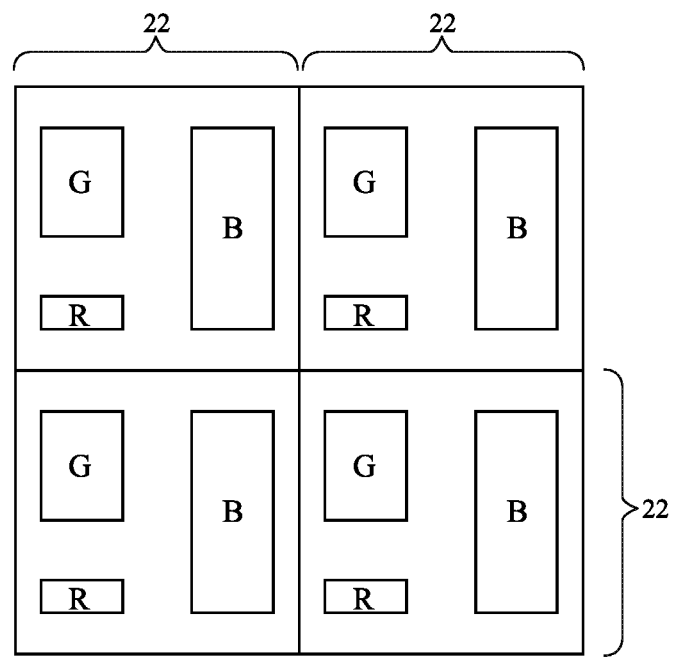
FIG. 10A is a top view of an illustrative display with pixels that include sub-pixels of different colors in accordance with an embodiment.
Figure 10B:
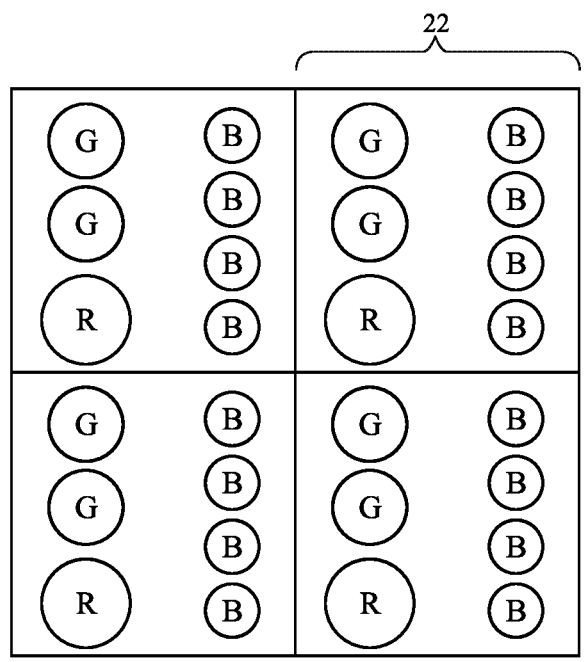
FIG. 10B is a top view of an illustrative display with pixels that include multiple sub-pixels of a single color in accordance with an embodiment.

To achieve a more neutral color in reflections off of the polarizer-free display, the anode sizes for each color may be tuned. FIGS. 10A and 10B show an example of this type. FIG. 10A is a top view of an illustrative display with pixels that include sub-pixels of different colors. As shown, each pixel 22 includes a red sub-pixel R, a green sub-pixel G, and a blue sub-pixel B. Each sub-pixel includes one corresponding anode. In FIG. 10A, the red, green, and blue sub-pixels (and corresponding anodes) have different sizes. To mitigate color shifts in ambient light reflections, the sizes of the anodes may be changed.

The overall diffraction envelope for each sub-pixel may be proportional to $\lambda/D$, where is the wavelength of light emitted by the sub-pixel (e.g., the wavelength at which light is emitted with a maximum intensity) and D is the diameter (or other defining maximum dimension) of the sub-pixel. To balance the color of reflections, it is therefore desirable for $\lambda/D$ to be approximately equal for each color. The wavelength of red light is greater than the wavelength of green light and the wavelength of green light is greater than the wavelength of blue light. Therefore, the diameter of the anodes may be selected such that the diameter of the red sub-pixels is greater than the diameter of the green sub-pixels and the diameter of the green sub-pixels is greater than the diameter of the blue sub-pixels.

As shown in FIG. 10A, the total light-emitting area for each color of sub-pixel may differ. In FIG. 10A, the total area of the blue sub-pixel is larger than the total area of the green sub-pixel and the total area of the green sub-pixel is greater than the total area of the red sub-pixel. These area ratios may be selected to achieve a desired white point of emitted light (as an example). To achieve these target area ratios while maintaining approximately constant $\lambda/D$ for each color of sub-pixel, the sub-pixels may be split into multiple different sub-pixels of the same color.

As shown in FIG. 10B, each pixel may include one red sub-pixel, two green sub-pixels, and four blue sub-pixels. The diameters D of the red, green, and blue sub-pixels in FIG. 10B are selected such that $\lambda/D$ remains approximately constant for each color. In other words, $\lambda/D$ for the red sub-pixel may be within 30% of $\lambda/D$ for the green sub-pixels, within 10% of $\lambda/D$ for the green sub-pixels, within 5% of $\lambda/D$ for the green sub-pixels, within 3% of $\lambda/D$ for the green sub-pixels, within 1% of $\lambda/D$ for the green sub-pixels, etc. Similarly, $\lambda/D$ for the red sub-pixel may be within 30% of $\lambda/D$ for the blue sub-pixels, within 10% of $\lambda/D$ for the blue sub-pixels, within 5% of $\lambda/D$ for the blue sub-pixels, within 3% of $\lambda/D$ for the blue sub-pixels, within 1% of $\lambda/D$ for the blue sub-pixels, etc. Also, $\lambda/D$ for the blue sub-pixel may be within 30% of $\lambda/D$ for the green sub-pixels, within 10% of $\lambda/D$ for the green sub-pixels, within 5% of $\lambda/D$ for the green sub-pixels, within 3% of $\lambda/D$ for the green sub-pixels, within 1% of $\lambda/D$ for the green sub-pixels, etc.

In FIG. 10B, the total area of the blue sub-pixels, red sub-pixels, and green sub-pixels remain the same or similar as in FIG. 10A. However, including multiple smaller green and blue sub-pixels as shown in FIG. 10B achieves a more neutral reflection color in polarizer-free displays.

Reducing the diameter of the sub-pixels may also mitigate reflection artifacts in the display. For example, a 20% reduction in diameter of each sub-pixel results in approximately a 50% reduction of reflections. The diameter (or other longest dimension) of each sub-pixel may be less than 50 microns, less than 40 microns, less than 30 microns, less than 20 microns, less than 10 microns, less than 8 microns, less than 5 microns, less than 3 microns, etc.

Figure 11:
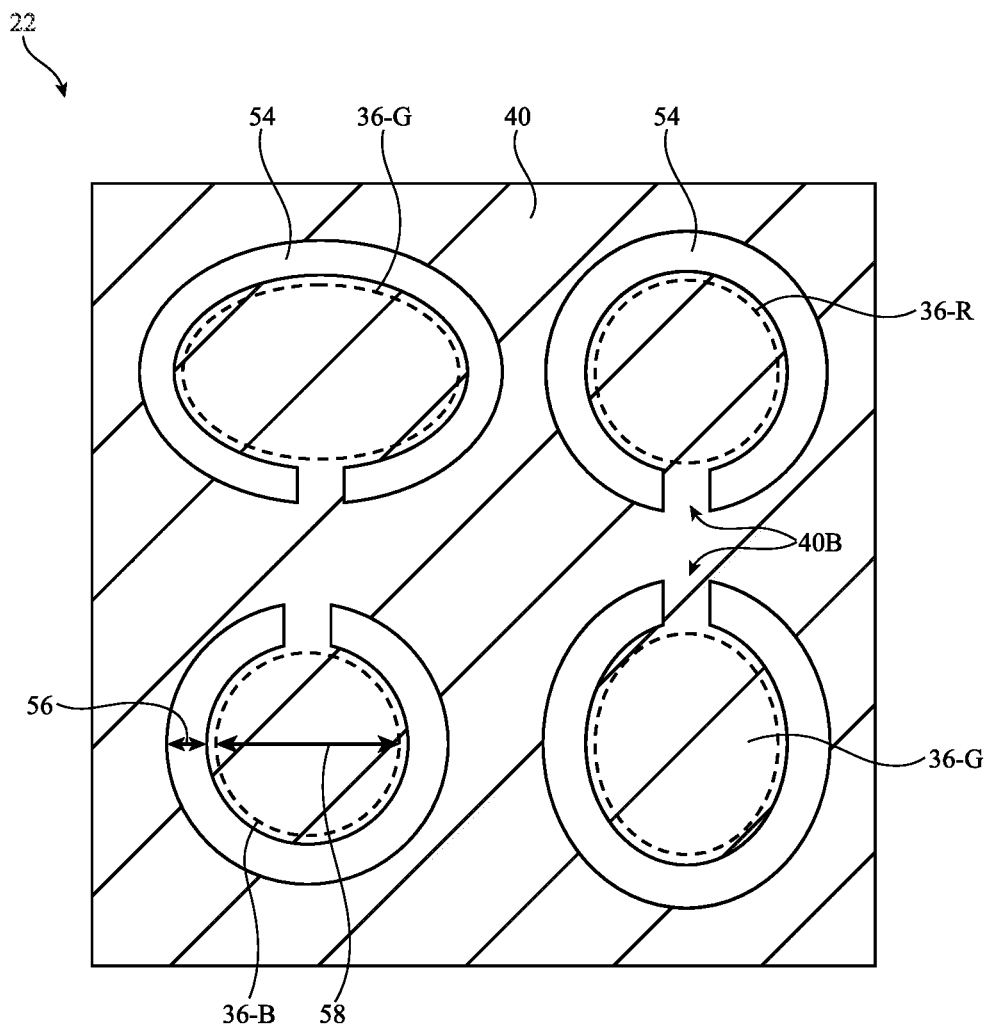
FIG. 11 is a top view of an illustrative display pixel with cathode openings in accordance with an embodiment.

Cathode layer 40 in the display panel may be at least partially reflective. Therefore, another way to mitigate ambient light reflections in the polarizer free display is to remove portions of the cathode over the black pixel definition layer 42. FIG. 11 is a top view of a pixel of this type. As shown, pixel 22 includes a cathode layer 40 with openings 54. The cathode layer 40 needs to overlap each anode in order for the OLED pixels to properly function. Therefore, a patch of the cathode layer overlaps each respective anode in the display. In the example of FIG. 11, a respective patch of the cathode layer overlaps first and second anodes 36-G for first and second green sub-pixels, an anode 36-R for a red sub-pixel, and an anode 36-B for a blue sub-pixel.

Removing the cathode layer in the region around the anode mitigates ambient light reflections without adversely affecting display performance. However, the cathode layer patch overlapping each anode needs to be electrically connected to the rest of the cathode layer. Therefore, each opening 54 forms a partial ring around a respective anode 36. The partial opening is interrupted by a cathode bridge portion 40-B that electrically connects the cathode layer patch overlapping the anode to the rest of the cathode layer. Each opening 54 may laterally surround at least 50% of the anode perimeter, at least 60% of the anode perimeter, at least 70% of the anode perimeter, at least 80% of the anode perimeter, at least 90% of the anode perimeter, at least 95% of the anode perimeter, etc.

The width 56 of each opening 54 may be smaller than the maximum dimension 58 of the anode surrounded by that opening. For example, width 56 may be less than 75% of dimension 58, less than 50% of dimension 58, less than 40% of dimension 58, less than 30% of dimension 58, less than 20% of dimension 58, less than 10% of dimension 58, etc.

The arrangement of FIG. 11 therefore ensures adequate functionality of the display (due to the cathode overlapping each anode and cathode blanket layer being formed over most of the display) while mitigating reflections (by selectively removing the cathode in a high-impact area over the black pixel definition layer at the perimeter of the anode).

Figure 12:
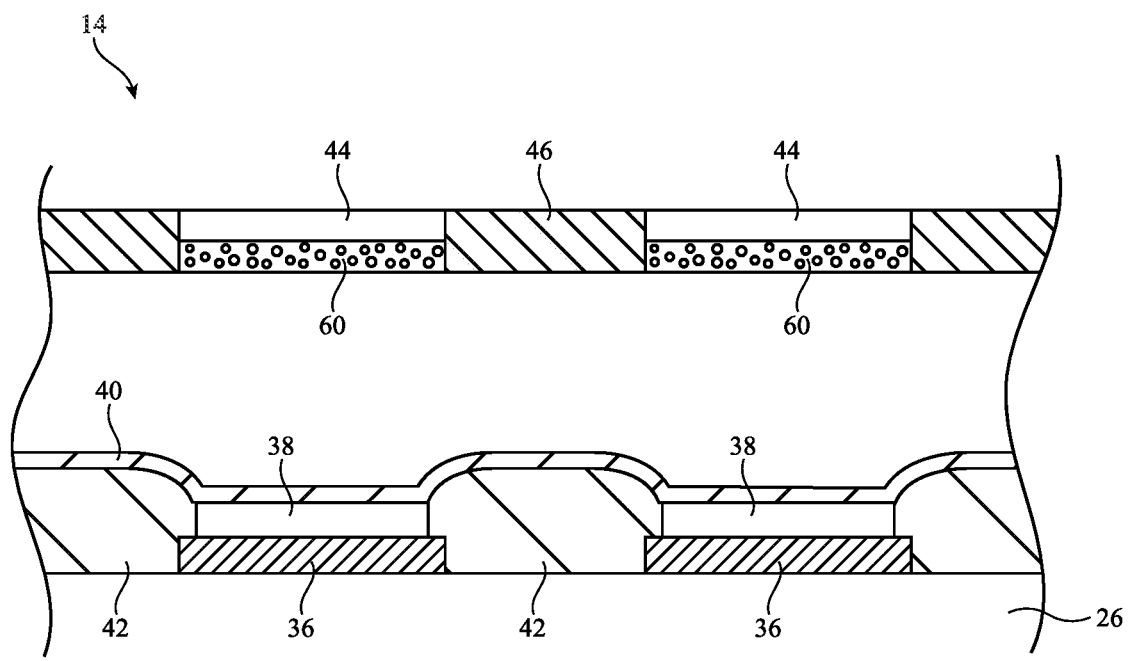
FIG. 12 is a cross-sectional side view of an illustrative display with diffuser layers and color filter elements in accordance with an embodiment.
Figure 13:
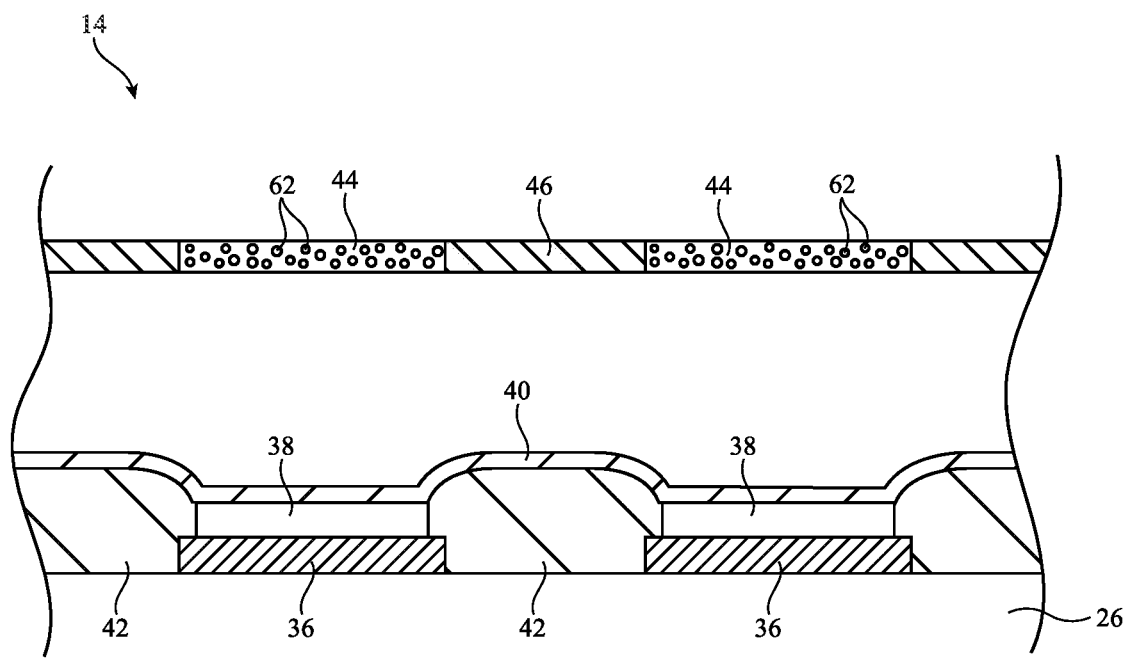
FIG. 13 is a cross-sectional side view of an illustrative display with color filter elements that include diffusive particles in accordance with an embodiment.

Another technique for mitigating diffractive artifacts is to include a diffuser in the display. FIGS. 12 and 13 show displays of this type. FIG. 12 is a cross-sectional side view of an illustrative display with a separate diffuser layer formed adjacent to each color filter element. As shown, each color filter element 44 may overlap a respective diffuser layer 60. Each diffuser layer may include diffusing particles (sometimes referred to as light scattering particles) in a host material. In FIG. 12, the host material may be transparent. The diffuser layers 60 and color filter elements 44 are formed within openings in the black matrix 46.

Alternatively, as shown in FIG. 13, diffusing particles 62 may be incorporated into the color filter elements 44 directly. In this arrangement, the color filtering material of each color filter element serves as a host material for the diffusing particles 62. The color filter elements therefore themselves also serve as a diffuser layer.

Diffusing the light as in FIG. 12 or FIG. 13 may mitigate diffractive reflection artifacts in the display.

To summarize, numerous techniques have been described to mitigate reflection artifacts in a polarizer-free display. The pixel definition layer may be black and have a low taper angle (as in FIG. 4), color filter elements may be included (as in FIG. 4), an intra-anode phase shift layer may be included (as in FIGS. 5 and 6), an inter-anode phase shift layer may be included (as in FIGS. 7 and 8A-8D), multiple sub-pixels of the same color may be used in a single pixel (as in FIG. 10B), the cathode layer may be patterned to have openings (as in FIG. 11), and the display may include diffuser layers (as in FIGS. 12 and 13). The aforementioned techniques may be used in any combination in a single display. The aforementioned techniques may be used in any combination in a circular-polarizer-free display or, in some cases, in a display that includes a circular polarizer.

The foregoing is merely illustrative and various modifications can be made by those skilled in the art without departing from the scope and spirit of the described embodiments. The foregoing embodiments may be implemented individually or in any combination.

What is claimed is:

1. A display comprising:
a substrate;
an array of light-emitting diode pixels on the substrate, wherein each light-emitting diode pixel includes a respective electrode; and
a phase shift layer on the substrate, where at least some of the electrodes at least partially overlap the phase shift layer and wherein first portions of the electrodes that overlap the phase shift layer are shifted away from the substrate relative to second portions of the electrodes that do not overlap the phase shift layer.

2. The display defined in claim 1, wherein some but not all of the electrodes at least partially overlap the phase shift layer.

3. The display defined in claim 1, wherein a first subset of the electrodes entirely overlap the phase shift layer and wherein a second subset of the electrodes have no overlap with the phase shift layer.

4. The display defined in claim 3, wherein the first and second subsets of the electrodes are distributed randomly across the array of light-emitting diode pixels.

5. The display defined in claim 1, wherein all of the electrodes partially but do not entirely overlap the phase shift layer.

6. The display defined in claim 5, wherein the phase shift layer has a plurality of discrete portions and wherein each portion has a circular footprint.

7. The display defined in claim 5, wherein the phase shift layer has a plurality of discrete portions and wherein each portion has a ring-shaped footprint.

8. The display defined in claim 1, wherein the phase shift layer is formed from silicon nitride.

9. The display defined in claim 1, further comprising:
a black pixel definition layer that defines a plurality of light-emitting apertures for the array of light-emitting diode pixels.

10. The display defined in claim 9, wherein the black pixel definition layer has a taper angle of less than 40 degrees.

11. The display defined in claim 9, further comprising:
a black matrix having a plurality of openings; and
a plurality of color filter elements, wherein each one of the plurality of color filer elements is formed in a respective opening of the plurality of openings.

12. The display defined in claim 11, further comprising:
diffusive particles that are incorporated in each one of the plurality of color filter elements.

13. The display defined in claim 11, further comprising:
a plurality of diffuser layers, wherein each one of the plurality of diffuser layers is formed in a respective opening of the plurality of openings.

14. The display defined in claim 1, wherein no circular polarizer is included over the array of light-emitting diode pixels.

15. A display comprising:
a substrate; and
an array of pixels on the substrate, wherein each pixel includes:
a first sub-pixel that emits light at a first wavelength;
at least two sub-pixels that emit light at a second wavelength, wherein the second wavelength is smaller than the first wavelength; and
at least two sub-pixels that emit light at a third wavelength, wherein the third wavelength is smaller than the second wavelength.

16. The display defined in claim 15, wherein the first sub-pixel has a first maximum dimension, wherein each one of the at least two sub-pixels that emit light at the second wavelength has a second maximum dimension, wherein each one of the at least two sub-pixels that emit light at the third wavelength has a third maximum dimension, wherein a first ratio between the first wavelength and the first maximum dimension is within 10% of a second ratio between the second wavelength and the second maximum dimension, wherein the first ratio is within 10% of a third ratio between the third wavelength and the third maximum dimension, and wherein the second ratio is within 10% of the third ratio.

17. The display defined in claim 15, wherein the at least two sub-pixels that emit light at the second wavelength comprises second and third sub-pixels and wherein the at least two sub-pixels that emit light at the third wavelength comprises fourth, fifth, sixth, and seventh sub-pixels.

18. The display defined in claim 15, wherein the first sub-pixel has a first maximum dimension, wherein each one of the at least two sub-pixels that emit light at the second wavelength has a second maximum dimension that is smaller than the first maximum dimension, and wherein each one of the at least two sub-pixels that emit light at the third wavelength has a third maximum dimension that is smaller than the second maximum dimension.

19. The display defined in claim 15, wherein no circular polarizer is included over the array of pixels.

20. A display comprising:
a substrate;
an array of pixels that includes first and second organic light-emitting diode pixels, wherein the first organic light-emitting diode pixel includes a first patterned electrode on the substrate and wherein the second organic light-emitting diode pixel includes a second patterned electrode on the substrate;
a black pixel definition layer that defines light-emitting apertures for the first and second organic light-emitting diode pixels; and
a common electrode formed over the substrate that has a first portion that overlaps the first patterned electrode and a second portion that overlaps the second patterned electrode, wherein the common electrode includes a first opening that partially but not entirely surrounds the first portion, wherein the common electrode includes a second opening that partially but not entirely surrounds the second portion, and wherein the first and second openings overlap the black pixel definition layer.

* * * * *

UNITED STATES PATENT AND TRADEMARK OFFICE
CERTIFICATE OF CORRECTION

PATENT NO. : 12,295,204 B2
APPLICATION NO. : 17/824787
DATED : May 6, 2025
INVENTOR(S) : Young Cheol Yang et al.

Page 1 of 1

It is certified that error appears in the above-identified patent and that said Letters Patent is hereby corrected as shown below:

In the Claims

Column 11, Line 48, "color filer" should read -- color filter --

Signed and Sealed this
Seventeenth Day of June, 2025

Coke Morgan Stewart
*Acting Director of the United States Patent and Trademark Office*